United States Patent
Johnson

(10) Patent No.: US 10,243,580 B1
(45) Date of Patent: Mar. 26, 2019

(54) DIGITAL TO ANALOG CONVERTER WITH ITERATIVE STEPPING TO EACH OUTPUT VALUE

(71) Applicant: Southwest Research Institute, San Antonio, TX (US)

(72) Inventor: Mark A. Johnson, Spicewood, TX (US)

(73) Assignee: SOUTHWEST RESEARCH INSTITUTE, San Antonio, TX (US)

( * ) Notice: Subject to any disclaimer, the term of this patent is extended or adjusted under 35 U.S.C. 154(b) by 0 days.

(21) Appl. No.: 15/984,623

(22) Filed: May 21, 2018

(51) Int. Cl.
*H03M 1/82* (2006.01)
*H03M 1/46* (2006.01)

(52) U.S. Cl.
CPC .............. *H03M 1/462* (2013.01); *H03M 1/82* (2013.01)

(58) Field of Classification Search
CPC .......... H03M 1/462; H03M 1/82; H03M 1/50; H03M 1/66; H03M 1/747

USPC .................................................. 341/152, 144
See application file for complete search history.

(56) References Cited

U.S. PATENT DOCUMENTS

| | | | |
|---|---|---|---|
| 7,019,677 B1* | 3/2006 | Soman ................ | H03M 1/1047 341/144 |
| 7,405,689 B2* | 7/2008 | Kernahan ............... | H03M 1/38 341/155 |
| 8,275,030 B2* | 9/2012 | Werner .................. | H04L 25/028 375/232 |
| 8,786,483 B1* | 7/2014 | Thompson .......... | H03M 1/0836 341/120 |
| 2013/0141263 A1* | 6/2013 | Debnath ............. | H03M 1/1038 341/120 |

* cited by examiner

*Primary Examiner* — Jean B Jeanglaude
(74) *Attorney, Agent, or Firm* — Livingston Law Firm

(57) ABSTRACT

A digital to analog converter (DAC) that provides an output that is iteratively stepped as the DAC increments or decrements from its digital input to analog output. The DAC has configurable registers to store a timer count value, an iteration value, and the input value. A state machine compares the iteration value to current DAC values, and adds or subtracts the iteration value until the final output is reached.

5 Claims, 3 Drawing Sheets

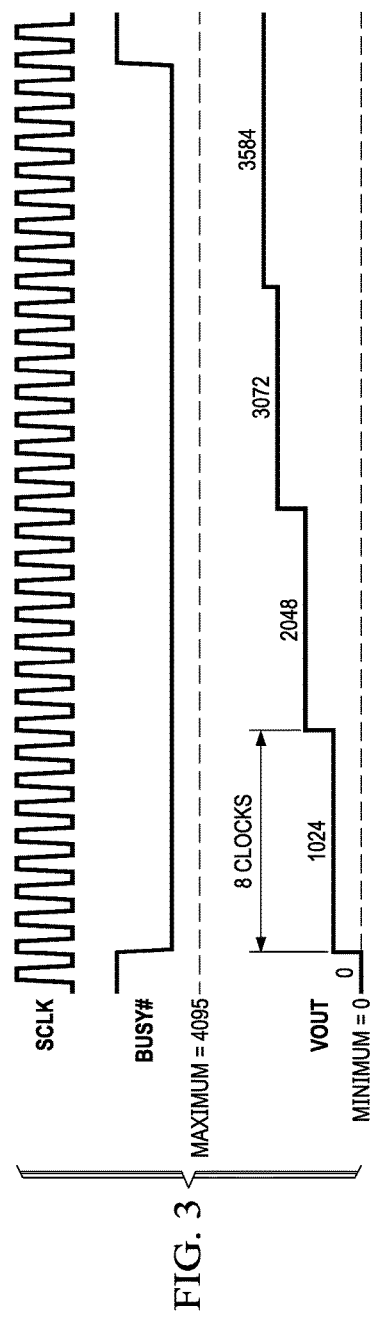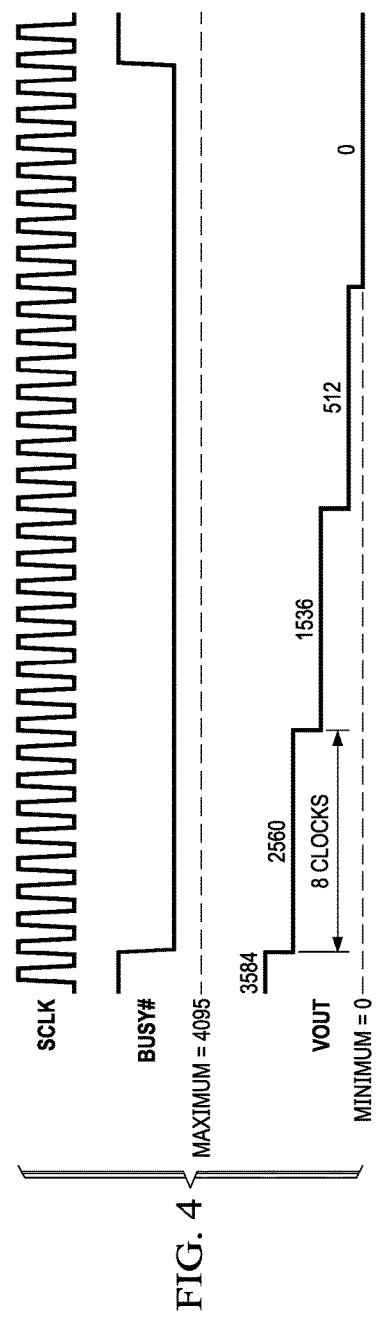

DIGITAL TO ANALOG CONVERTER WITH ITERATIVE STEPPING TO EACH OUTPUT VALUE

GOVERNMENT SUPPORT CLAUSE

This invention was made with United States Government Support under Contract No. NNG10EK25C funded by the National Aeronautics and Space Administration (NASA). The Government has certain rights in this invention.

TECHNICAL FIELD OF THE INVENTION

This invention relates to electronic circuits, and more particularly to digital to analog converters.

BACKGROUND OF THE INVENTION

A digital to analog converter (DAC) is an electronic circuit that converts a binary number to an analog voltage or current signal. A shortcoming of conventional DACs is their bulk output, which is not stepped or incremented. This limits their robustness and degrades performance. If a stepped output is desired, the user must step the output using lengthy tables or costly algorithms.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 3 illustrates an example of an incrementing output value.

FIG. 4 illustrates an example of a decrementing output value.

DETAILED DESCRIPTION OF THE INVENTION

The following description is directed to a digital to analog converter (DAC) that receives a digital value, and increments (or decrements) its output voltage until it reaches the analog of the digital input.

Figure 1:
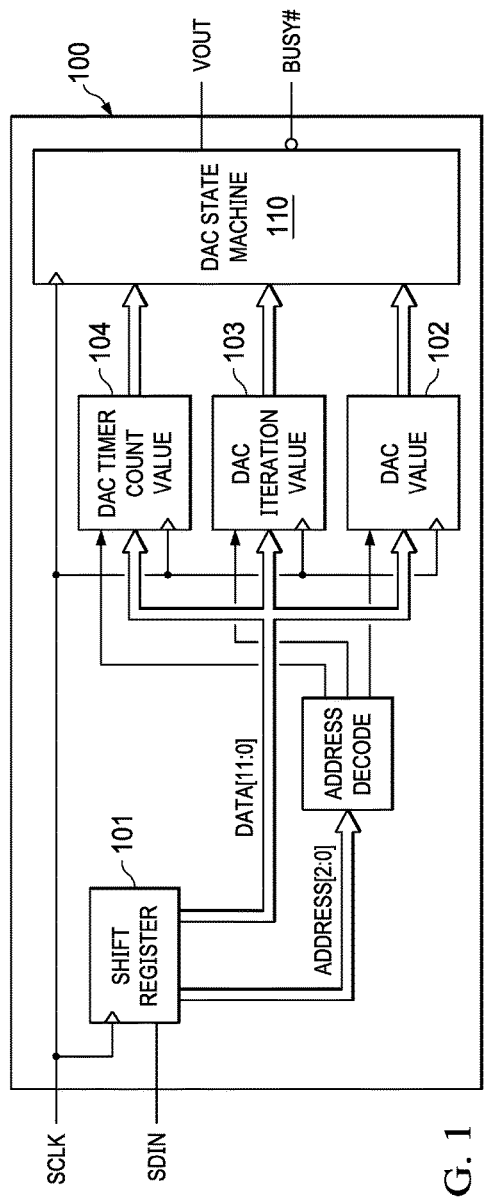
FIG. 1 illustrates a digital to analog converter in accordance with the invention.

FIG. 1 illustrates a digital-to-analog converter (DAC) 100 in accordance with the invention. Input shift register 101 receives the serial digital data input (SDIN), clocked with a clock signal (SCLK).

Figure 2:
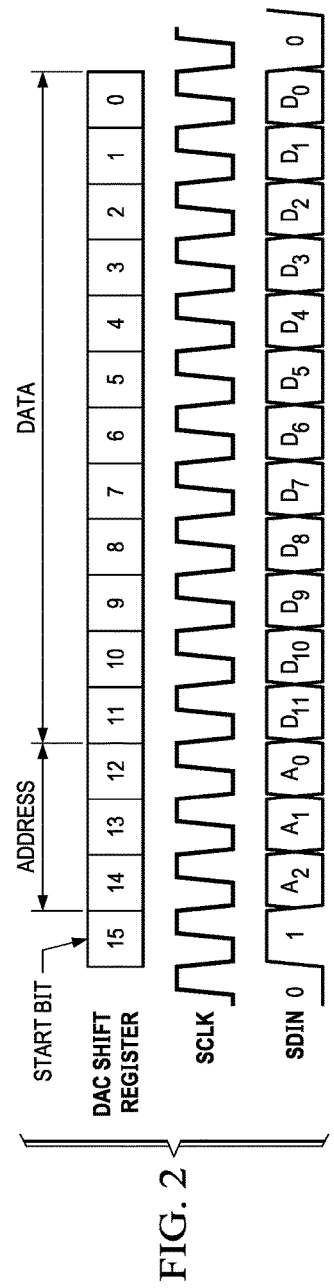
FIG. 2 illustrates the timing and input shift register format of the DAC of FIG. 1.

FIG. 2 illustrates the SDIN, SCLK, and contents of shift register 101. The first bit in the SDIN stream is a Start bit followed by three Address bits. This is followed by twelve Data bits.

Referring to both FIGS. 1 and 2, the address bits point to a given one of three registers: DAC value register 102, DAC Iteration Value register 103, and DAC Timer Count Value register 104.

These registers 102, 103, 104 allow DAC 100 to be configured with several values. A DAC Value register 102 stores the voltage level to be placed on the VOUT pin. A DAC Iteration Value register 103 stores the incremental value that is successively added or subtracted as each iteration occurs. A DAC Timer Count Value register 104 stores the number of clock periods that occur between each iteration.

Registers 102, 103, 104 are loaded using the protocol shown in FIG. 2. Once the DAC Timer Count and Iteration Values have been loaded, the DAC Value is loaded.

The loading of a DAC value into register 102, initiates the DAC State Machine 110 and causes a BUSY# signal to activate. As explained below, the DAC State Machine 110 iteratively sets the VOUT signal to its final desired value, i.e. the voltage analog of the digital value written to the DAC Value register 102.

The stepping calculations of the DAC State Machine 110 depend on a comparison between a current DAC Value minus VOUT and a newly assigned DAC Iteration Value. The comparison determines which of the two has the greater value. In one case, VOUT is incremented, and in the other, VOUT is decremented. Each case is described below.

DAC state machine 110 is a "state machine" in the sense that it identifies an appropriate process to execute in response to a given event, based on both the nature of the event and the current state of the system. As explained below, state machine 110 transitions from an Idle state, to a Value Load state, to a DAC Calculate state, to an EXIT state. DAC state machine 110 is implemented with appropriate processing hardware and software.

FIGS. 3 and 4 illustrate the cases where VOUT is incremented and decremented, respectively. This is the process performed by state machine 110 during the DAC Calculate state.

FIG. 3 illustrates the case where VOUT is incremented. For purposes of this example, the DAC Timer Count valve is 8, the DAC Iteration Value is 1024, and the DAC value is 3584. For this example, the process performed by DAC state machine 110 is as follows:

1. The (DAC Value (3584)−VOUT (0))=3584 is greater than the DAC Iteration Value (1024), so the DAC Iteration Value (1024) is added to VOUT: 1024. The BUSY# signal activates, indicating that the DAC update is in process.

2. The DAC Timer Counter increments until it reaches the DAC Timer Count Value (8), and the DAC Timer Counter is reset to 0.

3. The (DAC Value (3584)−VOUT (1024))=2560 is greater than the DAC Iteration Value (1024), so the DAC Iteration Value (1024) is added to VOUT: 2048.

4. The DAC Timer Counter increments until it reaches the DAC Timer Count Value (8), and the DAC Timer Counter is reset to 0.

5. The (DAC Value (3584)−VOUT (2048))=1536 is greater than the DAC Iteration Value (1024), so the DAC Iteration Value (1024) is added to VOUT: 3072.

6. The DAC Timer Counter increments until it reaches the DAC Timer Count Value (8), and the DAC Timer Counter is reset to 0.

7. The (DAC Value (3584)−VOUT (3072))=512 is not greater than the DAC Iteration Value (1024), so the DAC Value (3584) is placed on VOUT.

8. The DAC Timer Counter increments until it reaches the DAC Timer Count Value (8), and the DAC Timer Counter is reset to 0. The BUSY# signal returns to its inactive state, indicating that the DAC update has completed.

FIG. 4 illustrates the case where VOUT is incremented. For purposes of this example, the DAC Timer Count valve is 8, the DAC Iteration Value is 1024, and the DAC value is 0. For this example, the sequencing in the DAC State Machine 110 is as follows: The sequencing in the DAC State Machine for this example is as follows:

1. The (VOUT (3584)−DAC Value (0))=3584 is greater than the DAC Iteration Value (1024), so the DAC Iteration Value (1024) is subtracted from VOUT: 2560. The BUSY# signal activates, indicating that the DAC update is in process.

2. The DAC Timer Counter increments until it reaches the DAC Timer Count Value (8), and the DAC Timer Counter is reset to 0.

3. The (VOUT (2560)−DAC Value (0))=2560 is greater than the DAC Iteration Value (1024), so the DAC Iteration Value (1024) is subtracted from VOUT: 1536.

4. The DAC Timer Counter increments until it reaches the DAC Timer Count Value (8), and the DAC Timer Counter is reset to 0.

5. The (VOUT (1536)−DAC Value (0))=1536 is greater than the DAC Iteration Value (1024), so the DAC Iteration Value (1024) is subtracted from VOUT: 512.

6. The DAC Timer Counter increments until it reaches the DAC Timer Count Value (8), and the DAC Timer Counter is reset to 0.

7. The (VOUT (512)−DAC Value (0))=512 is not greater than the DAC Iteration Value (1024), so the DAC Value (0) is placed on VOUT.

8. The DAC Timer Counter increments until it reaches the DAC Timer Count Value (8), and the DAC Timer Counter is reset to 0. The BUSY# signal returns to its inactive state, indicating that the DAC update has completed.

The user also has the option to change the SCLK frequency to a lower frequency once the BUSY# signal activates. This provides the capability to set the iteration periods to any length.

Figure 5:
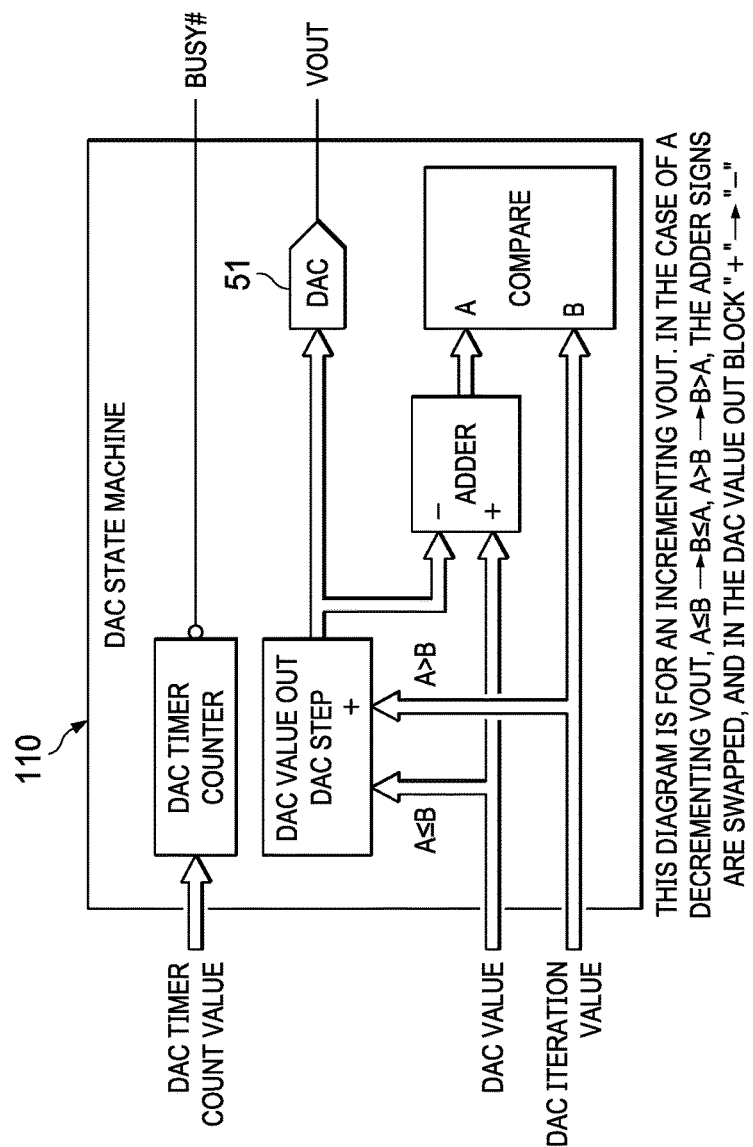
FIG. 5 illustrates the DAC state machine of FIG. 1, and its operation for an incrementing output value.

FIG. 5 illustrates DAC State Machine 110. The sequencing is for an incrementing VOUT. The state machine sequencing is as follows:

In an IDLE State, if "DAC Value" is not equal to the current "DAC Value Out", activate the BUSY# signal and jump to the next state VALUE_LOAD. Otherwise, return the BUSY# signal to its inactive state.

In a value VALUE_LOAD State, load a holding register DAC Step 51 with the current contents of DAC Value Out. Then, jump to the next state DAC_CALCULATE.

In the DAC_CALCULATE State, if no stepping is desired, the user has the option to place a default value of 0 in the DAC Iteration Value. If this is the case, load "DAC Value Out" with "DAC Value".

Otherwise, if the difference between "DAC Value" and the current "DAC Value Out" is less than or equal to "DAC Iteration Value", load "DAC Value Out" with "DAC Value".

If the difference between "DAC Value" and the current "DAC Value Out" is not less than or equal to "DAC Iteration Value", and if the DAC Value is incrementing, i.e. "DAC Value" is greater than "DAC Value Out", add "DAC Iteration Value" to "DAC Value Out".

If the difference between "DAC Value" and the current "DAC Value Out" is not less than or equal to "DAC Iteration Value", and if the DAC Value is decrementing, i.e. "DAC Value" is less than "DAC Value Out", "DAC Iteration Value" is subtracted from "DAC Value Out".

Next load the "DAC Timer Counter" with "DAC Timer Count Value".

Then jump to the EXIT state.

In the EXIT State, decrement the "DAC Timer Counter" until it reaches 0. When that occurs, return to the IDLE state.

DAC state machine 110 loops until "DAC Value Out" is equal to "DAC Value".

In the case of a decrementing VOUT, the A≤B is changed to B≤A, the A>B is changed to B>A, and the adder signs are swapped. Also, in the DAC Value Out, the DAC Step is "−".

A feature of the above-described incrementing/decrementing method is that the user need not take special precautions when changing a DAC from one value to another when the difference between the new and current values is significant. These scenarios without this stepping function have the potential for causing hardware failures especially in cases when the DAC is controlling a high voltage power supply. Thus, this invention eliminates the need for the user to implement lengthy tables or costly mathematical functions in the user's hardware.

Referring again to FIGS. 1 and 5, DAC 100 may be implemented with a commercially available general purpose DAC integrated circuit device. In addition to switches and resistor strings (the DAC 51 of FIG. 5), these DACs have register blocks and other auxiliary hardware. The DAC state machine 110 may be configured with a register block of such a DAC, in conjunction with its DAC. An example of a suitable DAC is the DAC121S101QML, a CMOS process integrated circuit, manufactured by National Semiconductor.

For conventional DAC devices, such as the ones described in the preceding paragraph, the BUSY# signal is a new input signal. An alternative to using the BUSY# signal is for the user to implement the SDOUT signal, a common implementation found in many DACs in the market today. This signal is the output complement to the input SDIN signal and gives the user the ability to be notified through a commonly used serial protocol that provides the user with the same information that the BUSY# signal provides. The DAC can be periodically queried to determine if a final value has been reached.

The invention claimed is:

1. An iterative digital-to-analog converter (DAC), the iterative DAC having a serial clock signal, comprising:
   a shift register for receiving a serial data stream, comprising data words, each data word having address bits and input data bits;
   a DAC value register for storing a digital input value as DAC Value, whose analog is to be the output of the iterative DAC as VOUT;
   an iteration value register for storing a DAC Iteration Value;
   a timer count value register for storing a number of clock periods that occur between iterations of the iterative DAC;
   a state machine for receiving the serial clock signal and for calculating VOUT, and having the following states: Idle, Value Load, DAC Calculate, and Exit;
   wherein in the Idle state, the state machine compares DAC Value to a current DAC Value Out, and if the values are not equal, activates a busy signal and proceeds to the Value Load state;
   wherein in the Value Load state, the state machine stores the current DAC Value Out and proceeds to the DAC Calculate state;
   wherein in the DAC Calculate state, the state machine compares the DAC Value to the current DAC Value Out, and if the difference is less than or equal to the DAC Iteration Value, changes DAC Value Out to DAC Value, and if the difference is greater than the DAC Iteration Value, adds or subtracts the DAC Iteration Value to or from the DAC Value Out; updates a DAC Timer Count, and jumps to the Exit state; and
   wherein in the Exit state, the state machine decrements the DAC Timer Count until it reaches zero.

2. The iterative DAC of claim 1, wherein all elements are fabricated as an integrated circuit.

3. The iterative DAC of claim 1, wherein iterative DAC is implemented with a commercially available DAC device.

4. The iterative DAC of claim 3, wherein the busy signal is added to the device as a new input.

5. The iterative DAC of claim 3, wherein the busy signal is implemented using an existing SDOUT input.

* * * * *